United States Patent [19]

Mueller et al.

[11] 4,133,697
[45] Jan. 9, 1979

[54] SOLAR ARRAY STRIP AND A METHOD FOR FORMING THE SAME

[76] Inventors: Robert A. Frosch, Administrator of the National Aeronautics and Space Administration, with respect to an invention of Robert L. Mueller, Azusa; Robert K. Yasui, Monterey Park, both of Calif.

[21] Appl. No.: 809,890

[22] Filed: Jun. 24, 1977

[51] Int. Cl.² .................................... H01L 31/06
[52] U.S. Cl. ......................... 136/89 P; 136/89 CC; 29/572
[58] Field of Search .................... 136/89 P, 89 CC

[56] References Cited

U.S. PATENT DOCUMENTS

| 3,502,507 | 3/1970 | Mann | 136/89 P |
| 3,509,431 | 4/1970 | Iles et al. | 136/89 P |
| 3,973,996 | 8/1976 | Kennedy | 136/89 P |
| 4,019,924 | 4/1977 | Kurth | 136/89 P |

*Primary Examiner*—John H. Mack
*Assistant Examiner*—William Leader
*Attorney, Agent, or Firm*—Monte F. Mott; John R. Manning; Wilfred Grifka

[57] ABSTRACT

Providing printed circuitry in a sandwiched relation with a pair of flexible layers of non-conductive material, depositing solder pads on the printed circuitry and storing the resulting substrate on a drum, withdrawing the substrate from the drum and incrementally advancing it along a linear path, serially transporting solderless solar cells into engagement with the pads and thereafter heating the pads for thus attaching the cells to the circuitry, cleaning excess flux from the solar cells, encapsulating the cells in a protective coating and thereafter spirally winding the resulting array on a drum.

1 Claim, 9 Drawing Figures

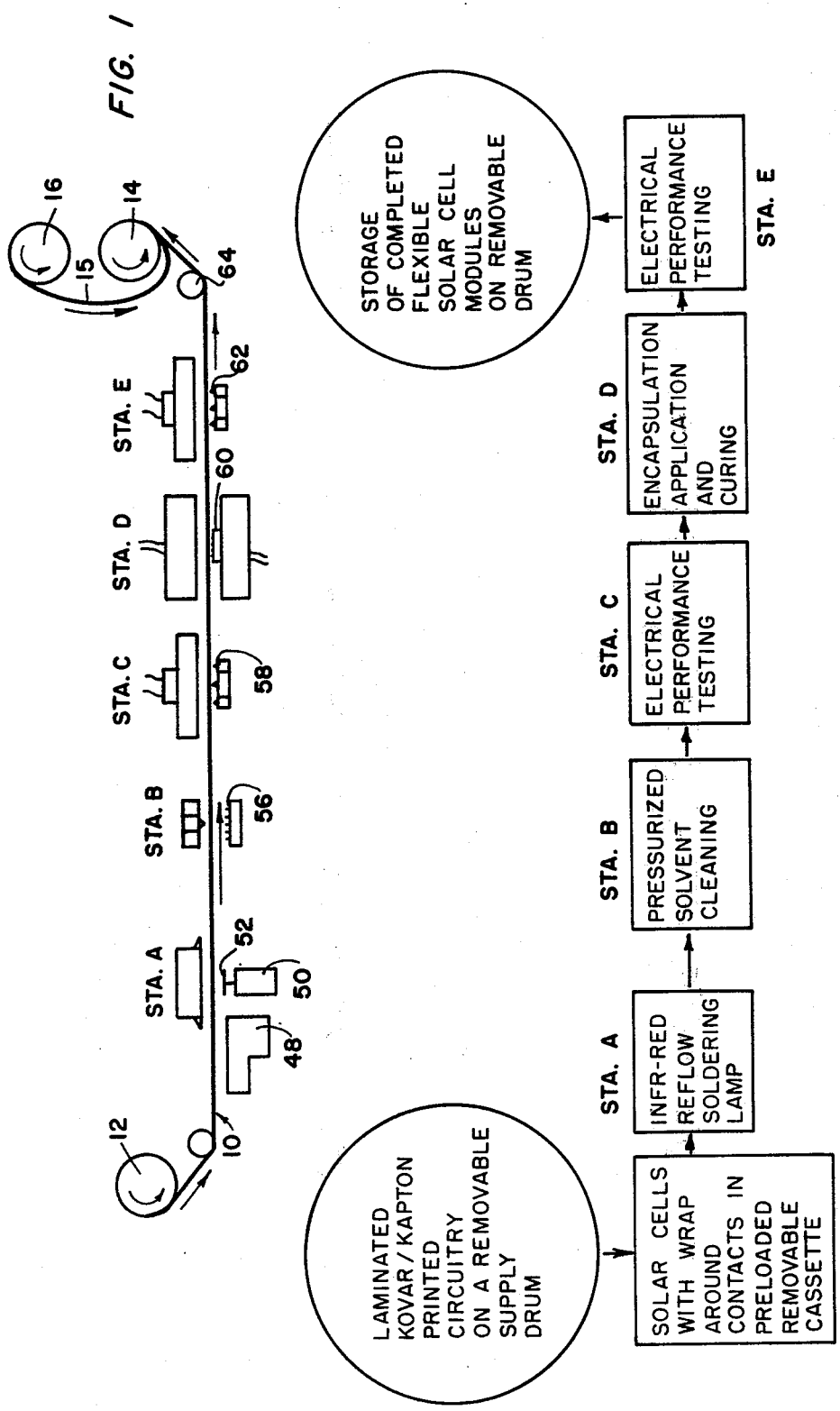

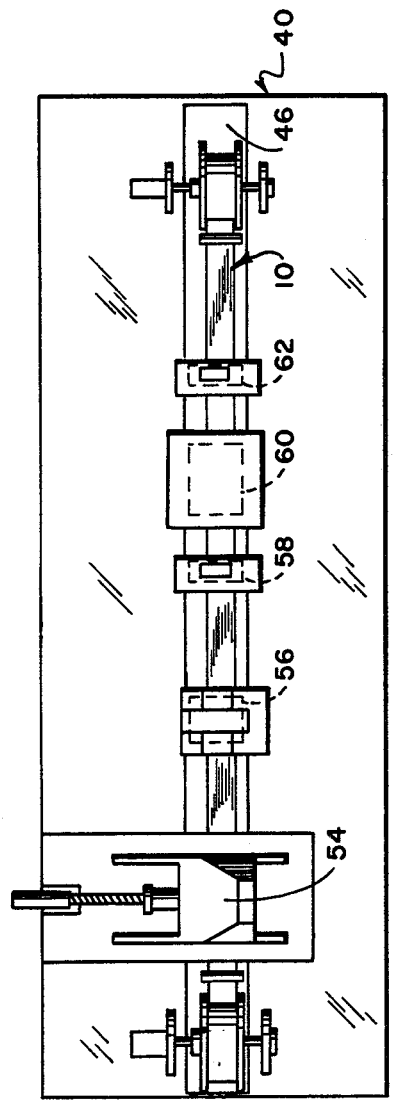
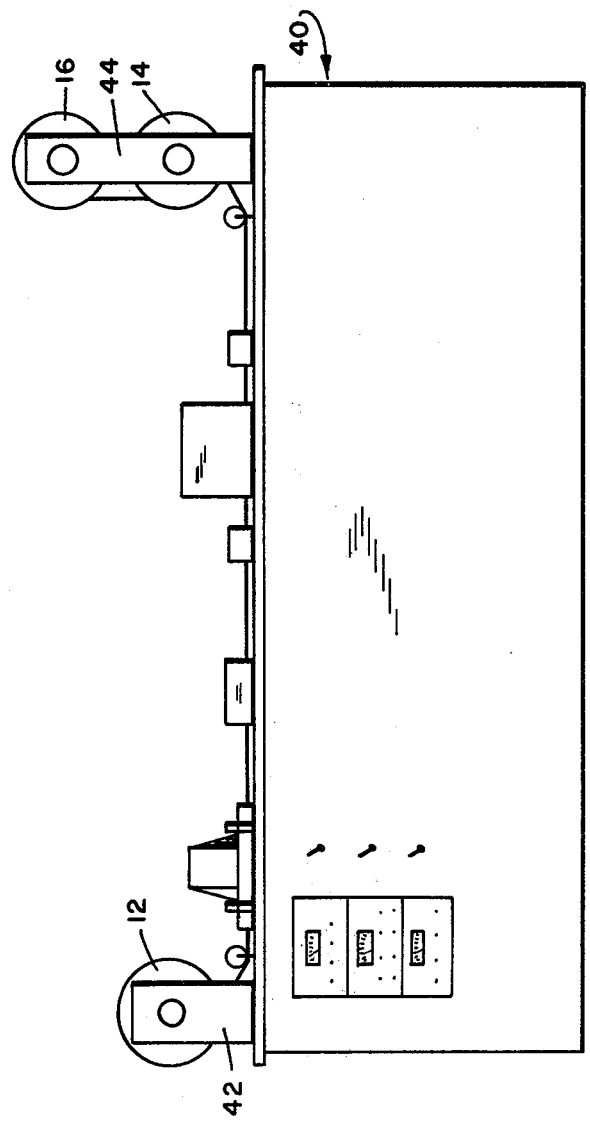
FIG. 3
FIG. 4

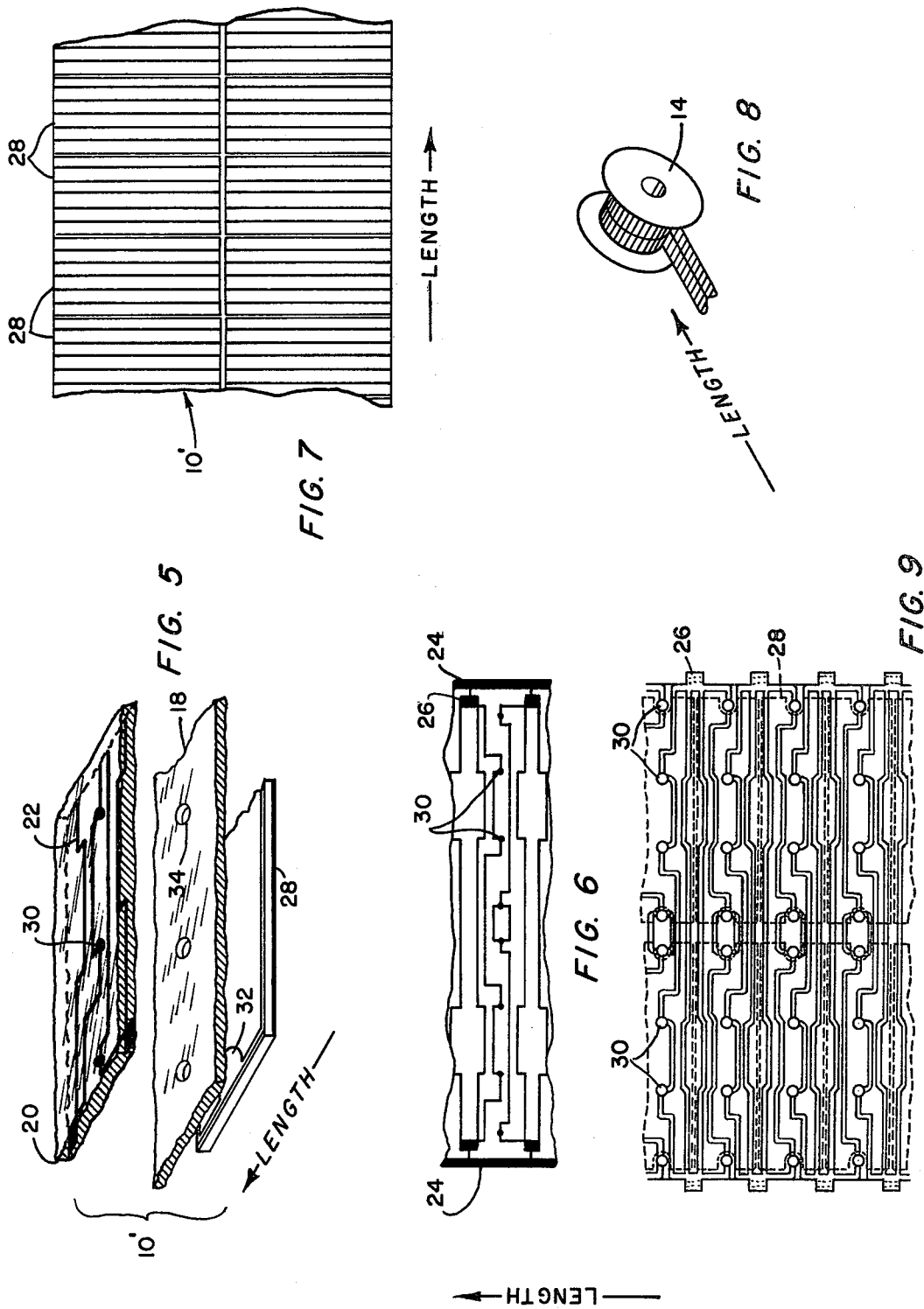

SOLAR ARRAY STRIP AND A METHOD FOR FORMING THE SAME

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

The invention generally relates to solar arrays and more particularly to a flexible solar array strip adapted to be stored in a helically wound roll, and a method for forming the same.

2. Description of the Prior Art

The prior art is, of course, replete with solar arrays and methods for forming such arrays. Moreover, it is well known that arrays of solar cells may be provided on flexible substrates for the use of such arrays aboard satellites and the like. Unfortunately, however, as can be appreciated by those familiar with the fabrication of solar arrays, the general utility of previously available arrays is impaired due to the inherent complexity of fabrication techniques which result in arrays, expensive in terms of both time and materials.

With the advent of renewed interest in and the placing of emphasis on developmental efforts calculated to reduce costs in the production of electrical energy from solar flux, it became apparent that there exists a need for an economic solar cell array having a broader range of utility.

It is therefore the general purpose of the instant invention to provide a flexible solar array strip formed by a method which readily lends itself to automated production techniques, whereby a continuous solar array strip may be economically provided for general usage in converting solar flux to electrical energy.

OBJECTS AND SUMMARY OF THE INVENTION

It is an object of the instant invention to provide an improved flexible solar array strip.

It is another object to provide an improved flexible solar array strip capable of being formed through methods which lend themselves to automation.

These and other objects and advantages are achieved through a the use of a flexible solar array strip fabricated employing a method in which printed circuitry is deposited in a sandwiched relationship between a pair of layers of a polyimide material, at least one layer having formed therein an ordered array of apertures, depositing solder pads in the apertures, orienting solderless solar cells characterized by wraparound contacts in predetermined relation with the apertures, applying infrared radiation to the pads for causing the solder to flow, cleaning flux from the solar cells, encapsulating the solar cells, and finally storing the resulting array strip on a take-up drum while simultaneously interwinding between layers of the strip a layer of protective material, as will become more readily apparent by reference to the following description and claims in light of the accompanying drawings.

BRIEF DESCRIPTION OF THE DRAWINGS

FIG. 1 is a diagrammatic view illustrating a method embodying the principles of the instant invention.

FIG. 2 is a diagrammatic view further depicting the method of the instant invention.

FIG. 3 is a top-plan view of a machine for performing the method of the instant invention.

FIG. 4 is a side elevational view of the machine shown in FIG. 3.

FIG. 5 is a fragmented, partially exploded perspective view of a portion of a solar array strip which embodies the principles of the instant invention.

FIG. 6 is a plan view, not to scale, of printed circuitry deposited on a flexible substrate employed in forming the flexible solar array strip which embodies the principles of the instant invention.

FIG. 7 is a fragmented, top-plan view of the strip.

FIG. 8 is a perspective view depicting one manner in which the solar array strip is stored.

FIG. 9 is a fragmentary top plan view of a portion of the strip illustrating electrical connections for the cells attached thereto.

DESCRIPTION OF THE PREFERRED EMBODIMENT

Referring now to the drawings with more particularity wherein like reference characters designate like or corresponding parts throughout the several views, there is depicted in FIGS. 1 and 2 a method embodying the principles of the instant invention.

Briefly, the method currently is performed using a strip of flexible substrate, generally designated 10, intermittently withdrawn from a supply drum 12, and thereafter delivered to a take-up or storage drum 14 as a completed solar array strip 10'. The strip 10' is characterized by an average thickness of 0.0067 inch. In practice, the completed strip 10' is helically wound about the drum 14 as a strip of protective resilient material 15 is withdrawn from a supply reel 16 and interwound therewith.

As best illustrated in FIG. 5, the completed strip 10' includes a pair of laminated layers, designated 18 and 20, having interposed therebetween printed circuitry, designated 22. In practice, the layers 18 and 20 are approximately 0.001 inch in thickness and are formed of Kapton polyimide film (type H). The layers 18 and 20 are suitably bonded together employing proven techniques. Between the layers 18 and 20, the circuitry 22 is approximately 0.0012 inch thick and is repeated twelve times in a ¾ inch length of the strip on 0.82 inch center lines. As a practical matter, the printed circuitry 22 also is deposited and etched employing known techniques and comprises conductors formed of copper or other suitable conductive material.

The substrate 10 is fabricated with strips of metallization 24, FIG. 6, running along both sides of the printed circuitry 22 and connected to the circuitry through index tabs 26. Solar cells 28 ultimately are deposited on the substrate in edge-to-edge engagement along imaginary transverse lines bisecting oppositely oriented tabs 26 and are connected with the circuitry through solder pads 30 which are completely covered by base layer 20. These pads are affixed to the cells 28 at points including contacts 32 provided for the cells, each contact being bonded through a separate aperture. Hence, as shown in FIG. 9, the strip of metallization must be carefully trimmed from the index tabs at the line of junction of the tabs and the circuitry in order to maintain proper substrate width and cell alignment.

It is important here to note that in order to facilitate connecting the circuitry 22 with the solar cells 28, and to provide access to test points for the circuitry, the layer 18 is suitably perforated to form perforations 34. Within the perforations 34, solder is deposited to thus form the solder pads 30, aforementioned. Preferably, the substrate is cleaned with acetone, using cotton swabs, before the solder is deposited in the perforations. In practice, a eutectic solder which meets Federal Specification QQ-8-S-571E is employed in forming the pads 30. Such solder comprises 62 percent tin, 36 percent lead, and 2 percent silver composition which is plastic over a temperature range of 177° to 189° C. The flux now used is Alpha 320-33, a liquid.

The solar cells 28, as employed, are the so-called "solderless" N on P silicon solar cells characterized by wraparound passivated contacts. Each of the solar cells 28 is joined to the circuitry 22 by four solder pads 30 so that the cell does not require a layer of solder. Thus a weight saving of approximately 30 percent over soldered contact cells is realized. This results in a lightweight array which also enjoys the advantage of being economically less expensive than an array in which a layer of solder is provided for joining the cells to the substrate.

Turning for a moment to FIG. 3, therein is illustrated a machine, generally designated 40, having a capability of performing the method embodying the instant invention. The machine 40, as shown, includes a bracket 42 for supporting the supply drum 12 and a bracket 44 for supporting the take-up drum 14 and the supply reel 16. The brackets 42 and 44 are located at opposite ends of a Teflon track 46 over which the flexible substrate 10 is drawn as it is incrementally advanced through stations A through E, at which steps of the method are performed.

As illustrated in FIG. 1, the station A includes a spring-loaded cassette 48 adapted to feed solar cells 28 to a solenoid operated elevator 50. In practice, a stack of solar cells 28 is deposited in an inverted disposition within the cassette 48 and ultimately fed therefrom, at timed intervals, to the elevator 50. The elevator 50 includes a receiver 52 which accepts and advances each individual solar cell 28 upwardly through a slotted opening, not shown, provided in the Teflon track 46. Thus the receiver advances each of the cells into engagement with the lower layer 18 of the flexible substrate 10. The receiver 52 supports the solar cell in an oriented engagement with the flexible substrate 10 until the solder of the pads 30 engaged thereby is caused to first flow and then set. Also provided at the station designated STA. A is an infrared lamp, not designated, the purpose of which is to cause radiation to impinge upon the upper surface of the flexible substrate 10 for thus heating the solder. As a practical matter, the infrared lamp is mounted for transverse adjustment above the Teflon track 46, at station A. Simply by positioning and then energizing the infrared lamp, the solder of the solder pads 30 liquified and is caused to flow into engagement with the adjacent surface of the solar cell 28 supported thereagainst by the receiver 52. The lamp, of course, ultimately is de-energized, or, where desired, removed from station A to permit the solder to "set". In any event, the solder is permitted to set for thus attaching the cell 28 to the printed circuitry 22 of the substrate 10. The receiver 52 then is retracted by the elevator 50 in preparation to receive another solar cell fed thereto from the cassette 48. It will, of course, be appreciated that the receiver 52 simultaneously accepts as many solar cells 28 as are required to span the width of the strip 10'.

The drums 12 and 14 are now indexed and the flexible substrate 10 is advanced for advancing the solar cells 28 attached to the substrate 10 to station B at which a spray applicator 56 is employed for spraying under pressure a suitable flux solvent for performing a cleaning function for the cells. Upon again being advanced, the substrate 10 advances through a distance sufficient for positioning the cells in close proximity with a plurality of electrical probes 58, located at station C. These probes extend through apertures registered with the index tabs 26 and serve to engage the tabs for determining the electrical performance for the solar cells. The cells are next advanced to station D at which a suitable coating is applied to the surfaces thereof for encapsulating the cells. An epoxy resin, if desired, can be employed for this purpose. The encapsulated cells 28 are now advanced to station E at which probes 62 are applied for again testing the electrical performance of the cells, in their encapsulated condition. Of course, in the event a defective cell is detected, it is appropriately identified for subsequent removal. As the thus completed solar array strip 10' is advanced from station E, it is caused to progress along a path located beneath a guide roller 64 toward the take-up drum 14, to be wound thereabout. The supply reel 16, of course, feeds a protective layer of resilient material, such as polyethylene, in an interwound relation between the helical layers of the strip 10' as the strip is wound on the drum 14.

Thus the method which embodies the principles of the instant invention provides an improved flexible solar array strip wound on a take-up drum 14, as indicated in FIG. 8.

While the invention which embodies the principles of the instant invention is believed to be apparent from the preceding description thereof, it is important to note that the invention is embodied in a method particularly adapted to be fully automated. The method utilizes a flexible substrate including printed circuitry deposited thereon which is connected through the use of solder pads to surfaces of solar cells characterized by wraparound contacts. The solar cells thus attached to the flexible substrate ultimately are cleaned, tested, and encapsulated in a protective coating to provide an improved flexible solar array strip capable of being readily stored in a helically wound configuration upon a take-up drum for subsequent usage in the manufacture and fabrication of devices and systems having a capability of utilizing electrical energy developed in the strip in response to incident solar flux.

In view of the foregoing, it should readily be apparent that the flexible solar array strip and method for providing the same provides a practical solution to the perplexing problem of supplying relatively economic flexible solar array strips for use in industry at substantially reduced costs.

Although the invention has been herein shown and described in what is conceived to be the most practical and preferred embodiment, it is recognized that departures may be made therefrom within the scope of the invention, which is not to be limited to the illustrative details disclosed.

What is claimed is:

1. An improved flexible solar array strip particularly suited for automated production comprising:
   A. at least one pair of wrap-around contact solar cells arranged in juxtaposition, each cell of said pair having its contacts arranged in coplanar relation;
   B. a flexible substrate for said pair of cells comprising an elongated strip consisting of a pair of layers of polyimide film bonded in superimposed relation, one layer of said pair comprising a base layer and one layer of the pair comprising a cover layer;
   C. means defining a segmented printed circuit extended between the layers of film for electrically interconnecting said solar cells;
   D. means defining in said cover layer a plurality of apertures disposed in registered relation with segments of the printed circuits, said segments being completely covered by said base layer; and
   E. electrically conductive solder pads substantially filling said plurality of apertures for bonding the contacts of said solar cells to segments of said printed circuit, each contact being bonded through a separate aperture.

* * * * *